United States Patent [19]

Chan et al.

[11] Patent Number: 5,336,916
[45] Date of Patent: Aug. 9, 1994

[54] SRAM CELL AND STRUCTURE WITH POLYCRYSTALLINE P-CHANNEL LOAD DEVICES

[75] Inventors: Tsiu C. Chan, Carrollton; Frank R. Bryant, Denton; Lisa K. Jorgenson, Colleyville, all of Tex.

[73] Assignee: SGS-Thomson Microelectronics, Inc., Carrollton, Tex.

[21] Appl. No.: 919,958

[22] Filed: Jul. 27, 1992

Related U.S. Application Data

[62] Division of Ser. No. 709,354, Jun. 3, 1991, Pat. No. 5,204,279.

[51] Int. Cl.⁵ .............................................. H01L 29/78
[52] U.S. Cl. ..................................... 257/377; 257/393; 257/755; 257/382; 257/903
[58] Field of Search ............... 257/69, 377, 393, 755, 257/382, 903, 904; 437/200; 365/154, 156

[56] References Cited

U.S. PATENT DOCUMENTS

| | | | |
|---|---|---|---|
| 4,569,122 | 2/1986 | Chan | 257/904 |
| 4,581,623 | 4/1986 | Wang | 437/200 |
| 4,814,841 | 3/1989 | Masuoka et al. | 257/903 |
| 5,028,975 | 7/1991 | Nagasawa et al. | 257/903 |
| 5,132,771 | 7/1992 | Yamanaka et al. | 257/903 |
| 5,151,387 | 9/1992 | Brady et al. | 437/200 |

*Primary Examiner*—Robert Limanek
*Attorney, Agent, or Firm*—Kenneth C. Hill; Lisa K. Jorgenson; Richard K. Robinson

[57] ABSTRACT

An integrated circuit structure is suitable for use with SRAM memory devices. P-channel load devices are used in a 6-transistor SRAM cell. The P-channel devices are formed as polycrystalline silicon field effect transistors above the N-channel field effect transistors, which are formed in the substrate. In order to avoid formation of a P-N junction, a barrier layer is formed between P-type and N-type source/drain regions. The preferred barrier is a bilayer formed from a conductive material such as silicide over a doped polycrystalline silicon layer.

5 Claims, 2 Drawing Sheets

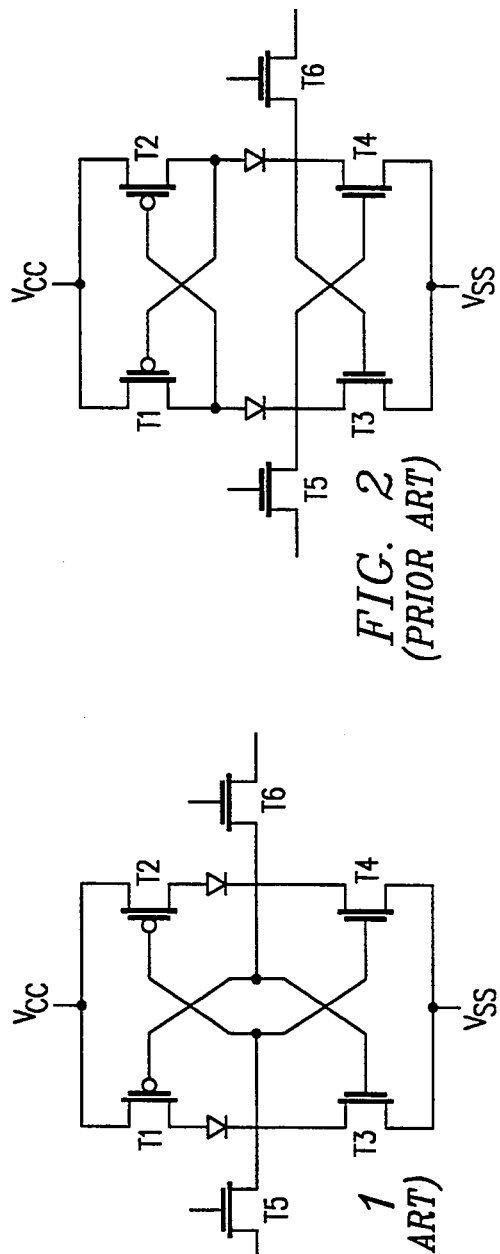
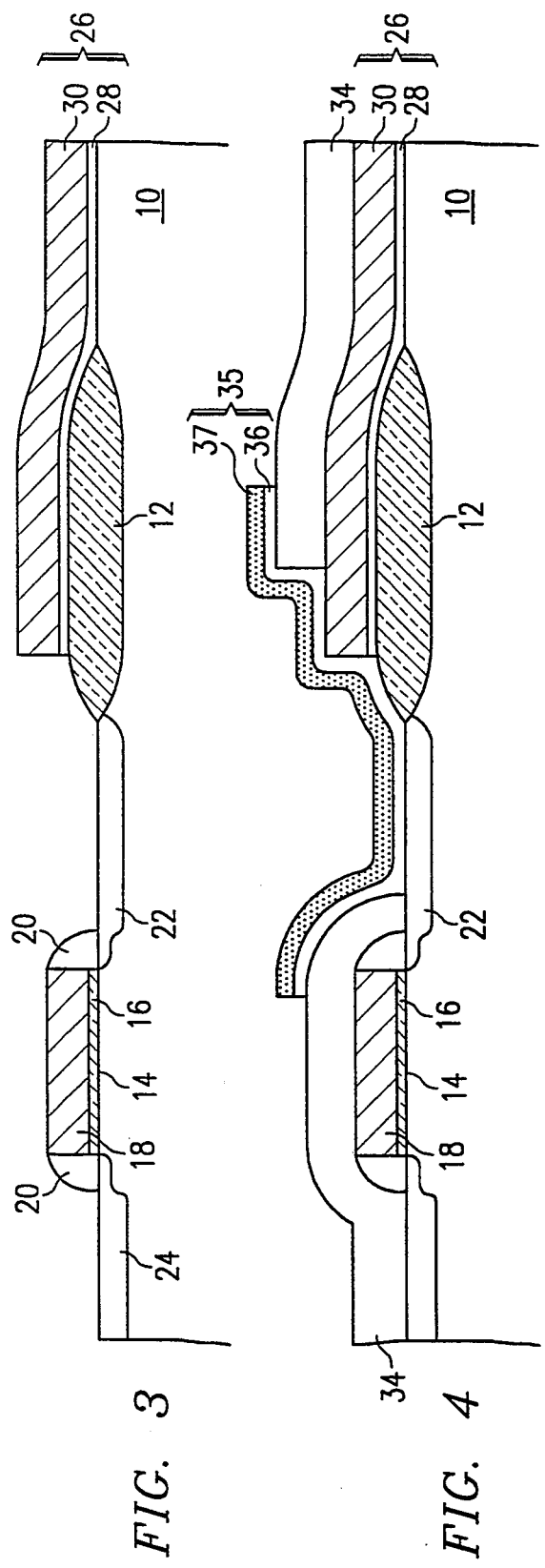
FIG. 1 (PRIOR ART)
FIG. 2 (PRIOR ART)
FIG. 3
FIG. 4

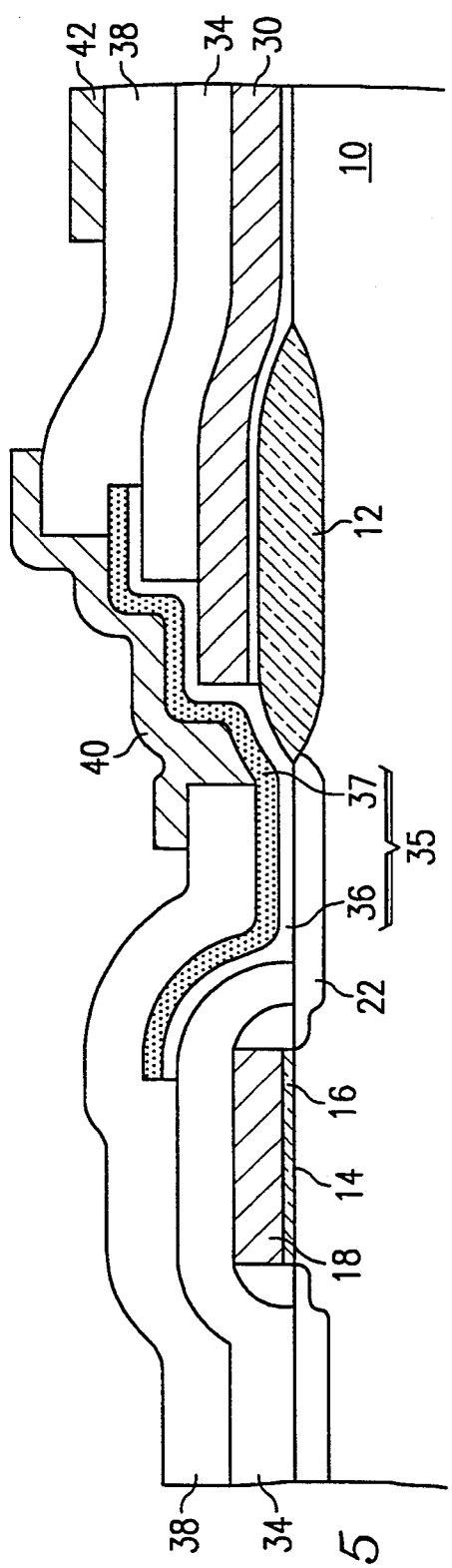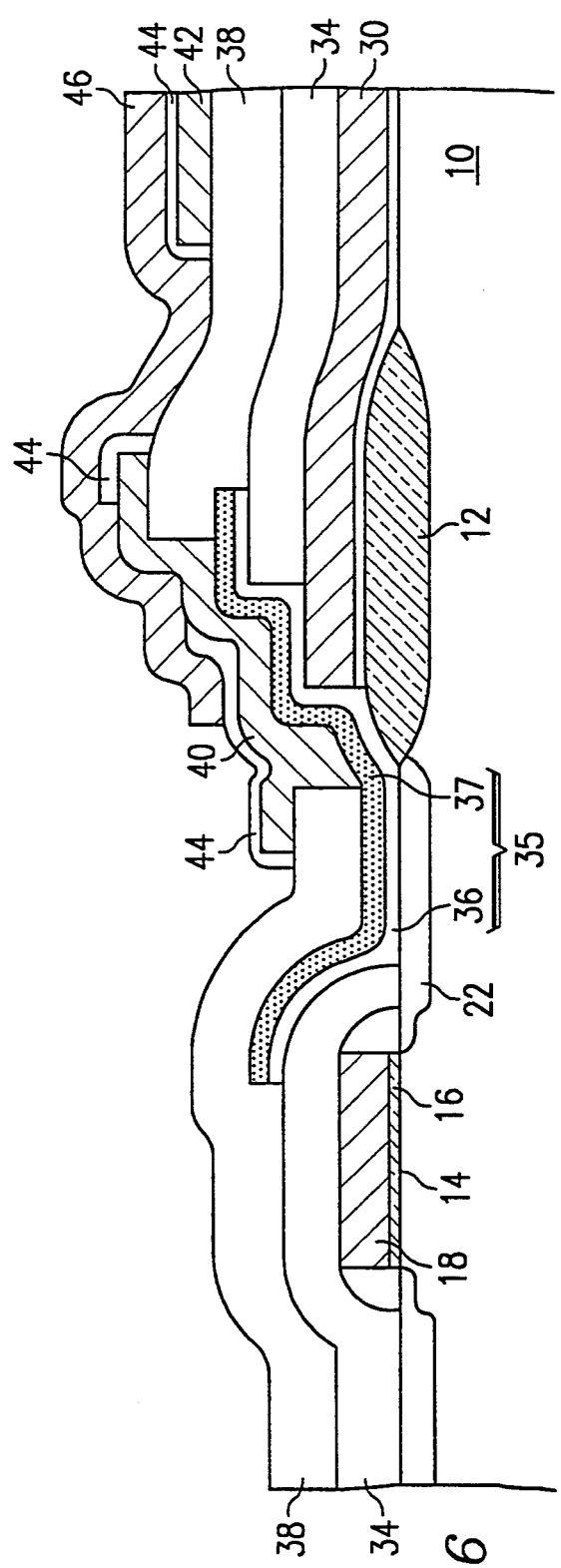

SRAM CELL AND STRUCTURE WITH POLYCRYSTALLINE P-CHANNEL LOAD DEVICES

This is a division of application Ser. No. 07/709,354, filed Jun. 3, 1991, now U.S. Pat. No. 5,204,279.

The basic SRAM cell can be formed using cross-coupled CMOS inverters having 2 each N-channel and P-channel transistors. The cell is accessed by, typically, 2 N-channel control gates for a standard SRAM cell and 4 control gates for 2-port memory devices. To conserve physical layout space, the P-channel transistors are often replaced with resistive loads.

Use of the P-channel transistors as the load for the SRAM cell, however, results in the cell having better electrical characteristics. Such cells are faster than those using resistive loads, since the P-channel transistors provide a higher drive current than high resistance devices. Also, use of P-channel transistors gives higher immunity to soft errors, such as those caused by alpha particle impacts and noise. The primary disadvantage of SRAM cells incorporating P-channel load transistors is that the layout area for each cell is significantly larger than those using resistive loads. This reduces device density and increases chip costs.

A disadvantage of using polycrystalline P-channel load transistors arises where ohmic contact is required between the interconnection of P-channel and N-channel transistors. Ohmic contact between interconnect layers is desirable because no P-N junction is formed. A P-N junction is formed, however, where polycrystalline interconnect lines having different conductivity types make contact. A similar junction can be formed when polycrystalline silicon lines having the same conductivity type, but very different doping levels (such as N− to N+) make contact.

In the prior art, as shown in FIGS. 1 and 2, for example, where P-channel transistors are used as the load devices, a junction diode will be formed at the location where a polycrystalline P-channel transistor contacts a N-channel transistor. As shown in FIG. 1, if the polycrystalline P-channel transistor T1 has a gate electrode made of a N-type conductivity polycrystalline silicon, a P-N junction or junction diode will be formed between the P+ source/drain region of the P-channel transistor and its N+ gate which connects to the source/drain region of the N-channel transistor T3. As shown in FIG. 2, if the conductivity type of the gate of the P-channel transistor is P-type, a junction diode will be formed between the P-channel gate electrode of T1 and the N+source/drain region of the N-channel transistor T4.

It would be desirable to use P-channel transistors as the load devices in an SRAM cell while preventing a junction diode from forming between P-channel and N-channel transistors. It would be desirable to use a conductive material as an interconnect at the shared contact areas between the P- and N-channel devices to prevent a junction diode from forming.

SUMMARY OF THE INVENTION

Therefore, according to the present invention, a method is provided for forming a semiconductor device structure with P-channel load devices of an integrated circuit, and the integrated circuit formed thereby, by forming a first insulating layer over a substrate. The first insulating layer is patterned and etched to expose an underlying conductive structure. An interconnect layer containing a doped polysilicon layer and a barrier layer is formed over the integrated circuit, patterned and etched to define a shared contact region covering the exposed underlying conductive structure. A first conductive layer is formed over the integrated circuit, patterned and etched to define a first gate electrode of a first P-channel field effect device. A gate oxide layer is formed over a portion of the first gate electrode of the first P-channel device. A second conductive layer is formed over the integrated circuit, patterned and etched to define a source/drain and channel region of the first gate electrode of the first P-channel device.

BRIEF DESCRIPTION OF THE DRAWINGS

The novel features believed characteristic of the invention are set forth in the appended claims. The invention itself, however, as well as a preferred mode of use, and advantages thereof, will best be understood by reference to the following detailed description of an illustrative embodiment when read in conjunction with the accompanying drawings, wherein:

FIGS. 1-2 illustrate a schematic representation of the SRAM prior art circuit.

FIGS. 3-6 illustrate a preferred method for fabricating a semiconductor device structure, according to the present invention.

DETAILED DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Referring to FIG. 3, an integrated circuit device is to be formed in a silicon substrate 10. Selected regions of the substrate 10 are oxidized to form a field oxide insulating region 12. A first N-channel field effect device 14 having a gate oxide layer 16, a first gate electrode 18, sidewall oxide spacers 20 and source/drain regions 22, 24 are manufactured by methods known in the art. Gate electrode 18 is generally formed from a first polycrystalline silicon layer, such as commonly used to form gate electrodes or field effect devices. A second N-channel field effect device 26 is formed by methods known in the art having a gate oxide layer 28 and a second gate electrode 30. As with the first N-channel field effect device 14, the second N-channel field effect device 26 is generally formed from a first polycrystalline silicon layer. The source/drain region 22 of device 14 and the gate electrode 30 form the interconnected conductive structures of the N-channel devices.

Referring to FIG. 4, a first oxide insulating layer 34 is formed over the integrated circuit by known methods. Insulating layer 34 is patterned and etched to expose a portion of the underlying conductive structure source/drain region 22 of device 14. A portion of the second gate electrode 30 of the second N-channel device 26 may also be exposed during the patterning and etching steps. Source/drain region 22 and gate electrode 30 of the first and second N-channel field effect devices respectively are typically implanted with a N+ type dopant such as arsenic or phosphorus.

Device fabrication up to this stage utilizes conventional process steps well known in the art. Historically, the SRAM cell is built with all N-channel and P-channel field effect devices or transistors being formed in the substrate. In order to increase packing density while maintaining better electrical characteristics using P-channel transistors as load devices, the P-channel transistors in the present invention are stacked above the N-channel transistors.

An interconnect layer 35 containing a doped polysilicon layer 36 and a barrier layer 37 is formed over the surface of the integrated circuit. Polysilicon layer 36 is first deposited, then barrier layer 37 is deposited. The interconnect layer 35 is then patterned and etched by methods known in the art to form a shared contact region disposed over the exposed portions of source/drain region 22. Layer 35 will also be disposed over a portion of gate electrode 30 if gate 30 was exposed during the patterning and etching process of the first insulating layer 34. Polysilicon layer 36 is implanted with a N-type dopant. Barrier layer 37 is preferably a silicide.

Referring to FIG. 5, a second oxide insulating layer 38 may be formed over the integrated circuit, if necessary. Insulating layer 38, if formed, is then patterned and etched by methods known in the art to expose a portion of the interconnect layer 35. A first conductive layer is then deposited over the integrated circuit. The first conductive layer is then patterned and etched to define a first gate electrode 42 of a first P-channel field effect device. Alternatively, a second gate electrode 40 of a second P-channel field effect device may also be defined from the first conductive layer. The first conductive layer is typically a doped polysilicon. Thus, gate electrode 40 and gate electrode 42, if formed, are typically implanted with a P+ type dopant such as boron or boron diflouride.

If gate electrode 40 is formed, interconnect layer 35 is now a shared contact between gate electrode 40 of the second P-channel device and the source/drain region 22 of the first N-channel device. Interconnect layer 35 will also connect gate 30 of the second N-channel device to source/drain region 22 and gate electrode 40 if a portion of gate 30 was exposed. If gate 30 is not connected to the interconnect layer 35, it will connect to source/drain region 22 elsewhere (not shown). Polysilicon layer 36 may be implanted alternatively with a P-type dopant. In this case, polysilicon layer 36 will be disposed over the barrier layer 37 to form the shared contact.

Referring to FIG. 6, a gate oxide layer 44 is grown over the first gate electrode 42 of the first P-channel device and over the second gate electrode 40 of the second P-channel device, if formed. If the second gate electrode 40 is formed, the gate oxide layer 44 will be etched to expose a portion of the second gate 40.

A second conductive layer 46 is deposited over the integrated circuit and patterned and etched to form a source/drain and channel region of the first gate electrode 42 of the first P-channel field effect device. The second conductive layer will be disposed over the gate oxide covering gate 42 and the exposed portion of gate 40 if gate 40 is formed. The second conductive layer 46 is typically a doped polysilicon layer, lightly implanted with a N type dopant in the channel region directly over gate 42 and heavily implanted with a P+ type dopant such as boron in the source/drain region.

If gate electrode 40 is formed, the interconnect layer 35 is now a shared contact between gate electrode 40 of the second P-channel device, the source/drain region 22 of the first N-channel device and the source/drain and channel region 46 of the gate electrode 42. If gate electrode 40 is not formed on top of the interconnect layer 35 as shown, it will be connected to layer 35 elsewhere such as beside layer 35 coming out from the plane of the drawing as shown in FIGS. 5 and 6 or it will be connected to layer 35 via layer 46. The interconnect layer 35 will also connect gate 30 of the second N-channel device to source/drain region 22 and gate electrode 40 if a portion of gate 30 was exposed. The interconnect layer is then a shared contact between two N-channel and two P-channel field effect devices in a six transistor SRAM cell. The shared contact is now connecting materials having different conductivity types.

Connecting P-channel and N-channel field effect devices together requires connecting materials of different conductivity types, typically resulting in the formation of P-N junctions. Using a doped polysilicon layer with a barrier layer such as a refractory metal silicide as an interconnect layer or a shared contact between N-channel and P-channel transistors will prevent a P-N junction from forming. With the barrier layer disposed between the different polysilicon having different conductivity types, no P-N junction is formed and the series diodes, as depicted in the prior art FIGS. 1 and 2, will not form. A good ohmic contact will thus be made between these devices.

While the invention has been particularly shown and described with reference to a preferred embodiment, it will be understood by those skilled in the art that various changes in form and detail may be made therein without departing from the spirit and scope of the invention.

What is claimed is:

1. A structure consisting of a portion of a semiconductor integrated circuit, comprising:
   a substrate;
   a first field effect transistor formed within the substrate, and having a gate electrode separated therefrom by a gate oxide layer;
   a second field effect transistor formed within the substrate, and having a gate electrode separated therefrom by a gate oxide layer, the second transistor gate electrode further extending over a portion of a field oxide layer formed within the substrate;
   a first insulating layer disposed over a portion of the substrate and the first and second transistor gate electrodes, with an opening to expose a source/drain region of the first transistor and a portion of the second transistor gate electrode;
   a doped polysilicon layer over a portion of the first insulating layer and in the opening;
   a conductive barrier layer overlying the doped polysilicon layer, wherein the doped polysilicon layer and the barrier layer define an intermediate interconnect layer in a shared contact opening;
   a second insulating layer disposed over the intermediate interconnect layer and the first insulating layer, the second insulating layer having an opening therein to expose a portion of the intermediate interconnect layer;

a polysilicon interconnect layer over the second insulating layer and contacting the intermediate interconnect layer through the opening in the second insulating layer, wherein a field effect transistor is formed in the polysilicon interconnect layer.

2. The structure of claim 1, wherein the barrier layer of the intermediate interconnect layer is a silicide.

3. The structure of claim 1, wherein the doped polysilicon layer of the intermediate interconnect layer is N-type.

4. The structure of claim 3, wherein the barrier layer of the intermediate interconnect layer is a silicide.

5. The structure of claim 1, wherein the field effect transistor formed in the polysilicon interconnect structure comprises:
a gate polysilicon interconnect layer, wherein a portion thereof contacts the conductive barrier layer through the opening in the second insulating layer;
a gate insulating layer in contact with a portion of the gate polysilicon interconnect layer; and
an upper polysilicon interconnect layer overlying the gate insulating layer, wherein the upper polysilicon interconnect layer contains doped regions defining source/drain regions and a channel region separated from the gate polysilicon interconnect layer by the gate insulating layer.

* * * * *